United States Patent
Sun et al.

(10) Patent No.: US 11,036,958 B2
(45) Date of Patent: Jun. 15, 2021

(54) LIGHT EMITTING DISPLAY PANEL AND MANUFACTURE METHOD THEREOF, DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Kuo Sun, Beijing (CN); Yang Wang, Beijing (CN); Guoqiang Ma, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 81 days.

(21) Appl. No.: 16/149,330

(22) Filed: Oct. 2, 2018

(65) Prior Publication Data
US 2019/0220644 A1    Jul. 18, 2019

(30) Foreign Application Priority Data

Jan. 12, 2018   (CN) .......................... 201810032053.X

(51) Int. Cl.
*G06K 9/00* (2006.01)
*H01L 27/32* (2006.01)
(Continued)

(52) U.S. Cl.
CPC ........ *G06K 9/0004* (2013.01); *H01L 27/3234* (2013.01); *H01L 27/3272* (2013.01);
(Continued)

(58) Field of Classification Search
None
See application file for complete search history.

(56) References Cited

U.S. PATENT DOCUMENTS 9,349,758 B2   5/2016  Ki et al.
10,430,000 B2* 10/2019  Wu ...................... G06F 3/0443
(Continued)

FOREIGN PATENT DOCUMENTS

CN    103942537 A    7/2014
CN    104881170 A    9/2015
(Continued)

OTHER PUBLICATIONS

The First Chinese Office Action dated Jan. 22, 2020; Appln. No. 201810032053.X.

*Primary Examiner* — Joseph R Haley

(57) ABSTRACT

A light emitting display panel and a manufacture method thereof, and a display device are provided. The light emitting display panel includes a display region and a periphery region; the periphery region includes a first wire; the display region includes a light shielding layer and a fingerprint detection circuit; the light shielding layer includes at least one opening, the at least one opening at least partially overlaps the fingerprint detection circuit in a direction perpendicular to a panel surface of the display panel to allow light passing through the opening to be incident onto the fingerprint detection circuit, and the light shielding layer and the first wire are in same one layer.

18 Claims, 7 Drawing Sheets

(51) Int. Cl.
*H01L 51/56* (2006.01)
*H01L 51/00* (2006.01)
*H01L 27/146* (2006.01)

(52) U.S. Cl.
CPC .......... *H01L 51/0097* (2013.01); *H01L 51/56* (2013.01); *H01L 27/14678* (2013.01); *H01L 2251/5338* (2013.01)

(56) References Cited

U.S. PATENT DOCUMENTS

| | | |
|---|---|---|
| 10,572,711 B2 | 2/2020 | Li et al. |
| 2003/0010922 A1 | 1/2003 | Yoon et al. |
| 2017/0062760 A1 | 3/2017 | Kim |
| 2017/0249494 A1 | 8/2017 | Zhang et al. |
| 2018/0151641 A1* | 5/2018 | Choo .................. H04M 1/0266 |
| 2018/0314873 A1* | 11/2018 | Yang ........................ G06F 3/042 |
| 2018/0341290 A1* | 11/2018 | Sim ........................ G06F 1/1643 |
| 2019/0012555 A1* | 1/2019 | Bae ....................... G06K 9/0004 |
| 2019/0334105 A1 | 10/2019 | Choi et al. |

FOREIGN PATENT DOCUMENTS

| | | |
|---|---|---|
| CN | 106096595 A | 11/2016 |
| CN | 106486520 A | 3/2017 |
| CN | 106601133 A | 4/2017 |
| CN | 106716642 A | 5/2017 |
| CN | 106940488 A | 7/2017 |
| CN | 107086236 A | 8/2017 |

* cited by examiner

LIGHT EMITTING DISPLAY PANEL AND MANUFACTURE METHOD THEREOF, DISPLAY DEVICE

CROSS REFERENCE TO RELATED APPLICATIONS

The present application claims priority to the Chinese patent application No. 201810032053.X, filed on Jan. 12, 2018, the entire disclosure of which is incorporated herein by reference as part of the present application.

TECHNICAL FIELD

Embodiments of the present disclosure relate to a light emitting display panel and a manufacture method thereof, and a display device.

BACKGROUND

The application of organic light emitting diode display panels in display field are increasingly because the organic light emitting diode display panels have the advantages such as self-illumination, fast response, wide viewing angle, capability of being manufactured on flexible substrates, and so on. For example, the flexible organic light emitting diode display panels can also be applied in a variety of flexible and bendable products.

Fingerprint detection devices have been widely used in portable electronic devices such as mobile phones, tablet computers and so on. At present, the fingerprint detection device is separately disposed outside the display screen (that is, an outside screen type fingerprint detection mode is adopted), and this causes that the bezel of an electronic device such as mobile phone is wide. Fingerprint detection technologies comprise an optical fingerprint detection technology, an ultrasonic fingerprint detection technology, and so on. In the optical fingerprint detection technology, a fingerprint pattern is projected on the fingerprint detection device under the illumination of a light source, and then a digitized fingerprint image is formed. For example, the fingerprint image comprises ridge lines (lines with certain widths and extending directions in the fingerprint pattern) in black and valley lines (concave portions between the ridge lines) in white. The digitized fingerprint image can be processed by the algorithm of a fingerprint identification device to obtain information for applications such as unlocking, payment and so on.

SUMMARY

At least one embodiment of the present disclosure provides light emitting display panel, which comprises a display region and a periphery region. The periphery region comprises a first wire; the display region comprises a light shielding layer and a fingerprint detection circuit; the light shielding layer comprises at least one opening, and the at least one opening at least partially overlaps the fingerprint detection circuit in a direction perpendicular to a panel surface of the display panel to allow light passing through the opening to be incident onto the fingerprint detection circuit; and the light shielding layer and the first wire are in same one layer.

For example, the light emitting display panel provided by at least one embodiment of the present disclosure further comprises a base substrate. The display region further comprises a light emitting component on the base substrate; and the light shielding layer is on a side, which is closer to the base substrate, of the light emitting component.

For example, in the light emitting display panel provided by at least one embodiment of the present disclosure, the display region further comprises a thin film transistor for driving the light emitting component; and the light shielding layer is between the thin film transistor and the light emitting component in the direction perpendicular to the panel surface of the display panel.

For example, in the light emitting display panel provided by at least one embodiment of the present disclosure, the periphery region comprises a bending region; the bending region comprises at least one groove and a flexible insulating material filled in the groove; and the first wire extends across the bending region.

For example, in the light emitting display panel provided by at least one embodiment of the present disclosure, the bending region comprises an inorganic material layer; the groove is formed in the inorganic material layer; and the first wire further extends on the inorganic material layer.

For example, in the light emitting display panel provided by at least one embodiment of the present disclosure, the display region further comprises a second wire; the second wire extends from the display region to the periphery region; and the second wire electrically connects with the first wire.

For example, in the light emitting display panel provided by at least one embodiment of the present disclosure, the second wire is in same one layer as a source electrode or a drain electrode of the thin film transistor.

For example, in the light emitting display panel provided by at least one embodiment of the present disclosure, the second wire and a gate electrode of the thin film transistor are in same one layer.

For example, in the light emitting display panel provided by at least one embodiment of the present disclosure, the display region further comprises a second wire and the second wire extends from the display region to the periphery region; and the periphery region further comprises a first planarization layer, and the first wire and the second wire are respectively on different sides of the first planarization layer in the direction perpendicular to the panel surface of the display panel.

For example, in the light emitting display panel provided by at least one embodiment of the present disclosure, the second wire is closer to the base substrate compared with the first wire.

For example, in the light emitting display panel provided by at least one embodiment of the present disclosure, the periphery region comprises a plurality of first wires; the display region comprises a plurality of second wires, and the plurality of second wires extend from the display region to the periphery region; and the plurality of first wires and the plurality of second wires are alternately disposed on the different sides of the first planarization layer.

For example, in the light emitting display panel provided by at least one embodiment of the present disclosure, the periphery region comprises a plurality of first wires; the display region comprises a plurality of second wires, and the plurality of second wires extend from the display region to the periphery region; and orthographic projections of the plurality of first wires on the base substrate and orthographic projections of the plurality of second wires on the base substrate are alternately arranged in the periphery region.

For example, in the light emitting display panel provided by at least one embodiment of the present disclosure, the periphery region comprises a bending region and the bending region comprises at least one groove; and at least part of the first planarization layer is filled in the groove, and both the first wire and the second wire extend across the bending region.

For example, in the light emitting display panel provided by at least one embodiment of the present disclosure, the bending region comprises an inorganic material layer; the groove is formed in the inorganic material layer; the second wire is on the inorganic material layer; the first planarization layer is on the second wire; and the first wire is on the first planarization layer.

For example, in the light emitting display panel provided by at least one embodiment of the present disclosure, the light shielding layer comprises a plurality of openings, and the plurality of openings are arranged in an array.

For example, in the light emitting display panel provided by at least one embodiment of the present disclosure, the fingerprint detection circuit is on a surface, which is closer to the light shielding layer, of the base substrate; alternatively, the fingerprint detection circuit is on a surface, which is away from the light shielding layer, of the base substrate.

At least one embodiment of the present disclosure provides a display device, the display device comprises any one of the above-mentioned light emitting display panels.

At least one embodiment of the present disclosure provides a manufacture method of a light emitting display panel, which comprises: forming a display region and a periphery region. A first wire is formed in the periphery region; a light shielding layer and a fingerprint detection circuit are provided in the display region; the light shielding layer comprises at least one opening, the at least one opening at least partially overlaps the fingerprint detection circuit in a direction perpendicular to a panel surface of the display panel to allow light passing through the opening to be incident onto the fingerprint detection circuit, and the light shielding layer and the first wire are formed from a same material layer by a patterning process.

For example, the manufacture method of the light emitting display panel provided by at least one embodiment of the present disclosure further comprises: forming a plurality of openings arranged in an array in the light shielding layer.

For example, the manufacture method of the light emitting display panel provided by at least one embodiment of the present disclosure further comprises: forming at least one groove in the periphery region; and filling a flexible insulating material in the groove to form a bending region, in which the first wire is formed to extend across the bending region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
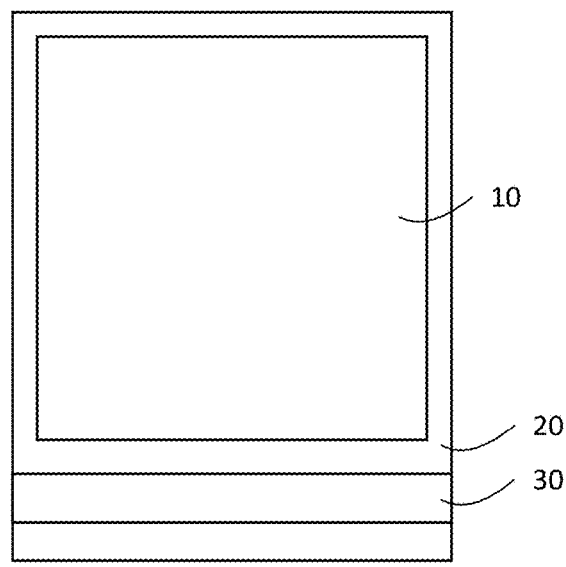
FIG. 1 is a plane schematic diagram of an organic light emitting display panel provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, a fingerprint detection component of a display panel is usually disposed in a non-display region of the display panel, and in this case, a pre-determined space in the non-display region is reserved to dispose the fingerprint detection component, which is disadvantageous for a narrow bezel design of the display panel. In addition, the fingerprint detection component is usually formed by a separate process, and thus the number of manufacture processes of the display panel is increased. A display panel with narrow bezel can be realized through integrating fingerprint detection capability into the display screen (that is, through adopting under screen type fingerprint detection). In addition, integration of display capability and touch control capability is also a development trend of current electronic devices. For example, a fingerprint detection device including a fingerprint detection circuit and an organic light emitting diode display panel with touch control capability can be manufactured, in which the detection circuit for fingerprint detection can be provided, for example, below the organic light emitting diode display panel.

At least one embodiment of the present disclosure provides a light emitting display panel, which comprises a display region and a periphery region; the periphery region comprises a first wire; the display region comprises a light shielding layer and a fingerprint detection circuit; the light shielding layer comprises at least one opening, and the at least one opening at least partially overlaps the fingerprint detection circuit in a direction perpendicular to a panel surface of the display panel to allow light passing through the opening to be incident onto the fingerprint detection circuit, and the light shielding layer and the first wire are in same one layer.

At least one embodiment of the present disclosure provides a display device and the display device comprises any one of the above-mentioned light emitting display panels.

At least one embodiment of the present disclosure provides a manufacture method of a light emitting display panel, the manufacture method comprises: forming a display region and a periphery region; a first wire is formed in the periphery region; a light shielding layer and a fingerprint detection circuit are provided in the display region; the light shielding layer comprises at least one opening, the at least one opening at least partially overlaps the fingerprint detection circuit in a direction perpendicular to a panel surface of the display panel to allow light passing through the opening to be incident onto the fingerprint detection circuit, and the light shielding layer and the first wire are formed from a same material layer by a patterning process.

It should be understood that, for the sake of clarity, descriptions are given to the embodiments of the present disclosure by taking the case that the light emitting display panel is an organic light emitting display panel for an example, but the light emitting display panel provided by at least one embodiment of the present disclosure is not limited to be the organic light emitting display panel.

The light emitting display panel and the manufacture method thereof, and the display device provided by the present disclosure are described below with reference to a plurality of specific embodiments.

At least one embodiment of the present disclosure provides an organic light emitting display panel, the organic light emitting display panel is, for example, a flexible display panel. As illustrated in FIG. 1, the organic light emitting display panel comprises a display region 10 and a periphery region 20. The display region 10 comprises a plurality of pixel units and the periphery region 20 is around the display region 10.

Figure 2:
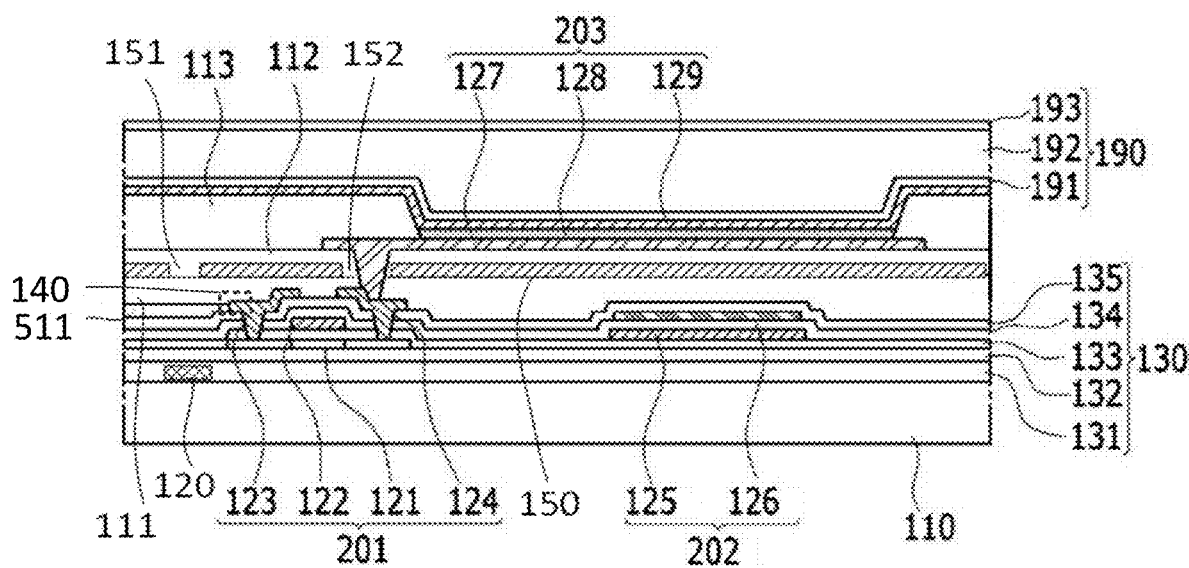
FIG. 2 is a sectional schematic diagram of a display region of an organic light emitting display panel provided by an embodiment of the present disclosure.
Figure 3:
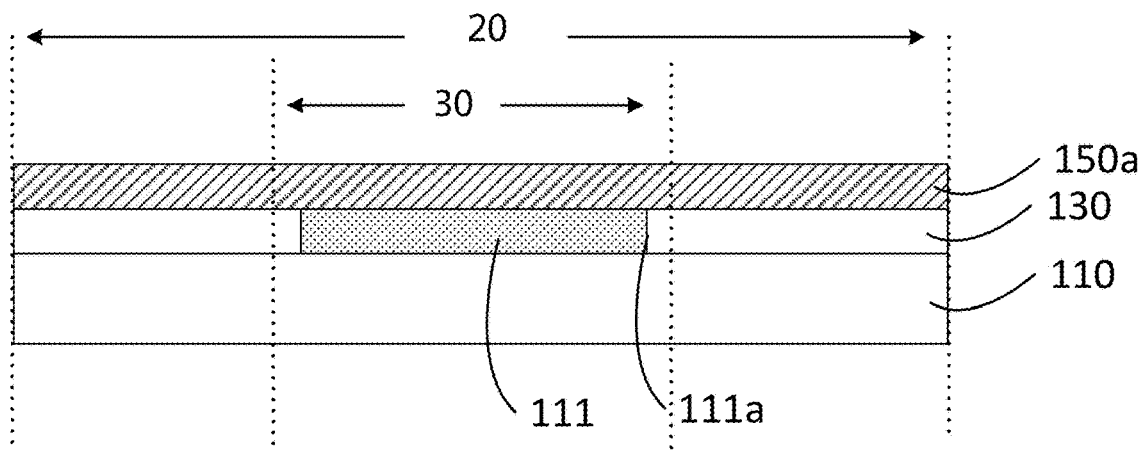
FIG. 3 is a sectional schematic diagram of a periphery region of an organic light emitting display panel provided by an embodiment of the present disclosure.
Figure 8:
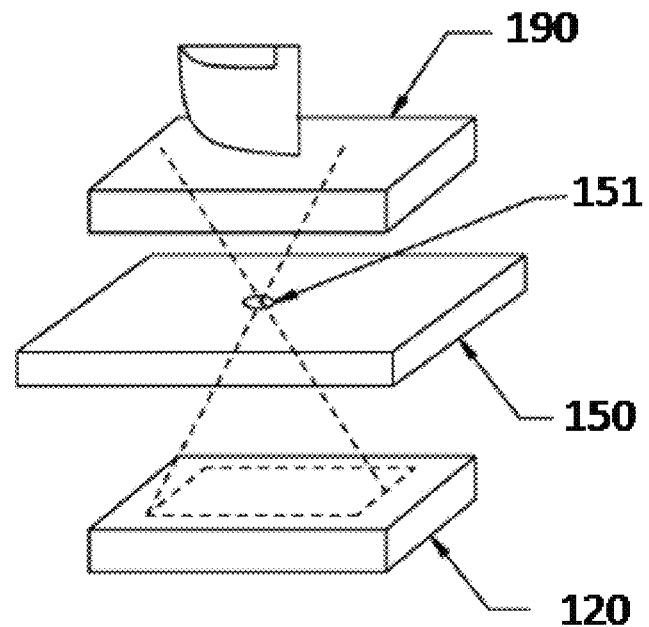
FIG. 8 is a schematic diagram of a fingerprint detection unit of an organic light emitting display panel performing a fingerprint detection, provided by an embodiment of the present disclosure.
Figure 9:
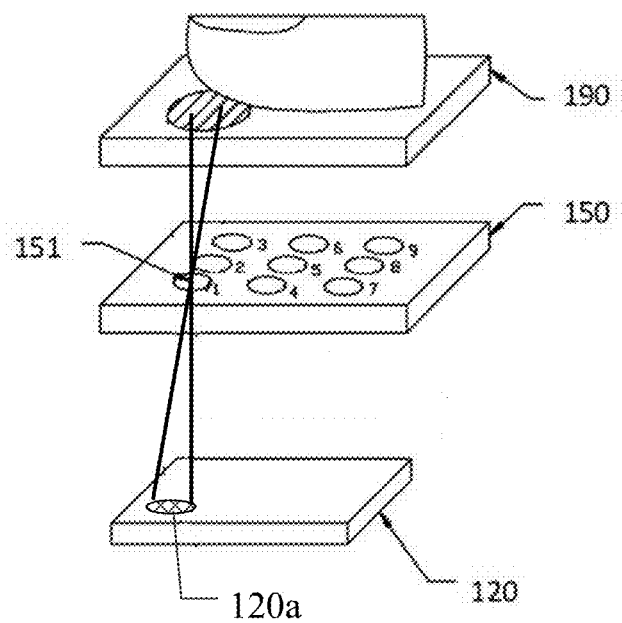
FIG. 9 is another schematic diagram of a fingerprint detection unit of an organic light emitting display panel performing a fingerprint detection, provided by an embodiment of the present disclosure.
Figure 12A:
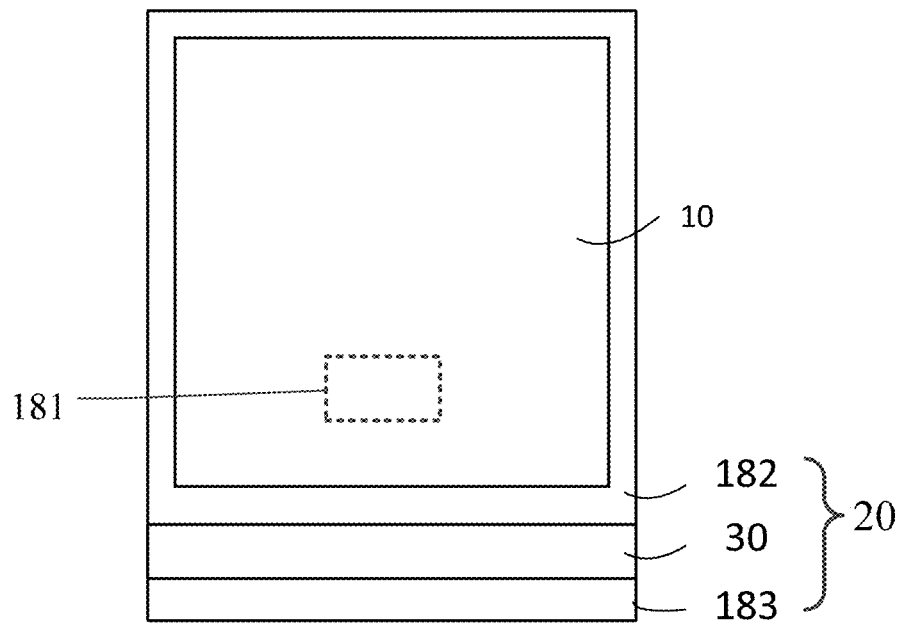
FIG. 12A is a plane schematic diagram of another organic light emitting display panel provided by an embodiment of the present disclosure.
Figure 12B:
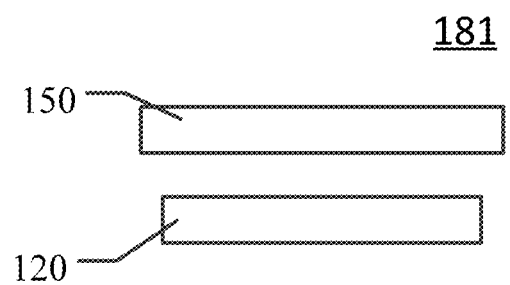
FIG. 12B is a sectional schematic diagram of a fingerprint detection region as illustrated in FIG. 12A.
Figure 12C:
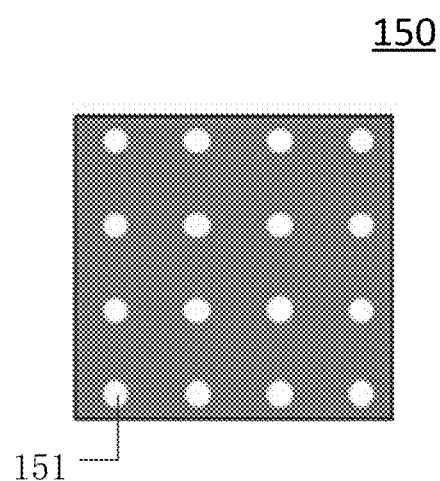
FIG. 12C is a plane schematic diagram of a light shielding layer as illustrated in FIG. 12B.

As illustrated in FIG. 3, the periphery region comprises a first wire 150a; as illustrated in FIG. 2, the display region comprises a light shielding layer 150 and a fingerprint detection circuit 120; the light shielding layer 150 comprises at least one opening 151, at least one opening 151 corresponds to the fingerprint detection circuit 120 in the direction perpendicular to the panel surface of the display panel (for example, at least one opening 151 at least partially overlaps the fingerprint detection circuit 120 in the direction perpendicular to the panel surface of the display panel), so as to allow light passing through the opening 151 to be incident onto the fingerprint detection circuit 120, and achieve the fingerprint detection function. The light shielding layer 150 and the first wire 150a are in same one layer. In some examples, as illustrated in FIG. 8 and FIG. 9, an orthographic projection of the fingerprint detection circuit 120 on the light shielding layer 150 are completed within the light shielding layer 150. In some examples, as illustrated in FIG. 12A, the fingerprint detection region 181 of the organic light emitting display panel is in partial region of the display region 10; as illustrated in FIG. 12B, the fingerprint detection region 181 includes the fingerprint detection circuit 120 and the light shielding layer 150, and the light shielding layer 150 is illustrated in FIG. 12C.

In at least one embodiment of the present disclosure, the light shielding layer 150 and the first wire 150a being in same one layer denotes that the light shielding layer 150 and the first wire 150a are formed, for example, by a patterning process using same one film or same one stacked layer, and therefore in the manufacture processes of the organic light emitting display panel, the light shielding layer 150 and the first wire 150a may be formed by a single patterning process, and the light shielding layer 150 need not to be formed by a separate patterning process, so that the manufacture processes of the display panel can be simplified. For example, the material of the light shielding layer 150 and the first wire 150a may comprise a metal or a metal alloy (for example, the light shielding layer 150 and the first wire 150a are formed of a metal or a metal alloy), and the metal comprises titanium, aluminum, molybdenum, copper, and so on. For example, the material of the light shielding layer 150 and the first wire 150a may also comprise a stack layer of metal materials, such as a stack layer of three metal layers of titanium/aluminum/titanium, a stack layer of three metal layers of molybdenum/aluminum/molybdenum, and so on, and no limitation will be given to the embodiment of the present disclosure in this aspect.

For example, in at least one embodiment of the present disclosure, as illustrated in FIG. 2, the display panel may further comprise a base substrate 110, the display region 10 may further comprise a light emitting component 203 on the base substrate 110. For example, the light shielding layer 150 is on a side, which is closer to the base substrate 110, of the light emitting component 203. That is, the light shielding layer 150 is closer to the base substrate 110 than the light emitting component 203. For example, the base substrate 110 is a flexible substrate, and the material of the flexible substrate may comprise, for example, polyimide, polyester (PET), polymethyl methacrylate (PMMA), and so on, which is not limited in at least one embodiment of the present disclosure. For example, the light emitting component 203 comprises a pixel electrode 127, a light emitting layer 128, and a common electrode 129. In a case where a voltage is applied between the pixel electrode 127 and the common electrode 129, the light emitting layer 128 may emit light of colors such as red, yellow, blue, and so on.

It should be understood that, in some embodiments, "the material of the flexible substrate may comprise, for example, polyimide, polyester (PET), polymethyl methacrylate (PMMA), and so on" denotes that "the flexible substrate may be formed of polyimide, polyester (PET), polymethyl methacrylate (PMMA), and so on", and other sentences with "the material of . . . may comprise . . . " have similar or same meaning, and no further descriptions will be given here.

For example, as illustrated in FIG. 2, the display region may further comprise a pixel driving circuit for driving the light emitting component 203 to emit light. The pixel driving circuit comprises a driving transistor, a switching transistor, a storage capacitor, and so on, and the thin film transistor 201 in FIG. 2 functions as the driving transistor, which applies a power voltage from a power line to the light emitting component 203. The light shielding layer 150 may be disposed, for example, between the thin film transistor 201 and the light emitting component 203, and in this case, the light shielding layer 150 does not affect the light emitting of the light emitting component 203, and does not reduce the light intensity of the display panel. For example, the thin film transistor 201 comprises a semiconductor layer 121, a gate electrode 122, a source electrode 123, a drain electrode 124, and so on. For example, the thin film transistor 201 and the light shielding layer 150 are insulated by a first planarization layer 111. For example, the light shielding layer 150 and the pixel electrode 127 are insulated by a second planarization layer 112. For example, the material of the first planarization layer 111 comprises an organic insulating material such as polyimide, resin and so on, and the material of the second planarization layer 112 comprises an organic insulating material such as polyimide, resin and so on.

For example, as illustrated in FIG. 1, the periphery region 20 may further comprise a bending region 30. As illustrated in FIG. 3, the bending region 30 comprises at least one groove 111a and a flexible insulating material filled in the groove 111a, and the first wire 150a extends across the bending region 30. For example, the flexible insulating material filled in the groove 111a corresponds to the first planarization layer 111, and the flexible insulating material and the material of the first planarization layer 111 are same, and the flexible insulating material and the first planarization layer 111 are formed, for example, in a single process. The material of the first planarization layer 111 may comprise, for example, a flexible insulating material such as polyimide, resin (for example, an acrylic resin, an epoxy resin, and so on), and so on. For example, in other examples, a plurality of grooves 111a, for example, grooves of two, three, four, and so on, in parallel may be provided, as long as the bending region can be bent. The flexible insulating material filled in the groove 111a serves as cushioning in the case where the bending region is bent, so as to reduce or prevent the occurrence of cracking caused by bending stress.

Figure 4:
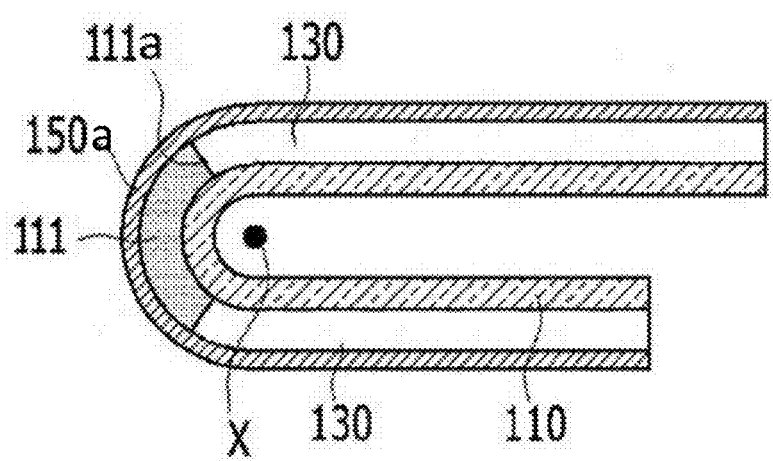
FIG. 4 is structural schematic diagram of a bending region of an organic light emitting display panel after bending, provided by an embodiment of the present disclosure.

In one example, as illustrated in FIG. 12A, the periphery region 20 comprises a first region 182, the bending region 30 and a second region 183, which are arranged in parallel in a plane parallel to the base substrate, and as illustrated in FIG. 4, the bending region 30 is configured to allow the first region to be able to be parallel to and laminated with the second region in the direction parallel to the base substrate. In the case where the display panel is not bent, the first region 182 is located at the side the bending region 30, which is closer to the display region 10, of the periphery region 20, and the second region 183 is located at the side the bending region 30, which is away to the display region 10, of the periphery region 20. In another example, the bending region 30 is configured to allow the area of the orthographic projection of the periphery region 20 on the base substrate 110 to be able to be reduced when the periphery region 20 is bent.

In the schematic diagram of FIG. 4, the flexible display panel is bent around a bending axis X, and an upper side (that is, the first region) of the flexible display panel in FIG. 4 is connected to the display region, and a lower side (that is, the second region) of the flexible display panel in FIG. 4 is used for bonding, for example, the lower side may be connected to a tape carrier package (TCP), a thin film package (COF), and so on, so as to be electrically connected to a driving chip (for example, a timing driver T-Con, a data driver, a gate driver, and so on). For example, the bending axis X extends parallel to a side boundary of the display panel, and the grooves extend parallel to the bending axis X.

For example, in at least one embodiment of the present disclosure, the bending region may comprise an insulating layer 130. For example, the insulating layer 130 comprises an inorganic material layer, and the material of the inorganic material layer may comprise, for example, silicon nitride, silicon oxide, and so on. Because the inorganic material layer may be brittle and not easily to be bent, the groove 111a may be formed in the inorganic material layer, and then the flexible insulating material may be filled in the groove 111a to form a bendable portion and, for example, a substantially flat surface. In at least one embodiment of the present disclosure, the first wire 150a may extend, for example, onto the inorganic material layer for implementing a corresponding electrical function, such as bonding, and so on. The above-mentioned flexible insulating material is less brittle and more flexible than the insulating layer 130.

In at least one embodiment of the present disclosure, the display region 10 also comprises, for example, the insulating layer 130. As illustrated in FIG. 2, the insulating layer 130 in the display region 10 comprises, for example, a barrier layer 131, a buffer layer 132, a gate insulating layer 133, a first interlayer insulating layer 134, and a second interlayer insulating layer 135. For example, the insulating layer 130 in the bending region may comprise one or more of the barrier layer 131, the buffer layer 132, the gate insulating layer 133, the first interlayer insulating layer 134, and the second interlayer insulating layer 135. For example, the buffer layer 132 in the display region 10 is formed of an inorganic material, and in this case the inorganic material layer in the bending region 30 and the buffer layer 132 in the display region 10 can be formed, for example, in a single patterning process. In an example, as illustrated in FIG. 2, the display region 10 also comprises a passivation layer 511 on the second interlayer insulating layer 135.

For example, as illustrated in FIG. 4, the bending region 30 may be bent at the groove 111a filled with the flexible insulating material around the axis X parallel to the base substrate 110, so as to reduce an area of the periphery region 20 in a plane in which the display region 10 is located, which is advantageous for the narrow bezel design of the display panel.

For example, the display region 10 may further comprise a second wire, and the second wire extends from the display region 10 to the periphery region 20. For example, the second wire may be electrically connected to the first wire 150a. In another example of the embodiment, the second wire may be, for example, a wire electrically connected to the source electrode or the drain electrode of the thin film transistor for transmitting data signals; alternatively, the second wire may be, for example, a wire electrically connected to the gate electrode of the thin film transistor for transmitting scan signals; alternatively, the second wire may also be, for example, a wire electrically connected to the source electrode or the drain electrode of the thin film transistor for transmitting power signals, and no limitation will be given to the embodiment of the present disclosure in this aspect. Correspondingly, the second wire may be, for example, in same one layer as the source electrode or the drain electrode of the thin film transistor, or in same one layer as the gate electrode of the thin film transistor.

For example, FIG. 2 illustrates a case where the second wire 140 is electrically connected to the source electrode 123 of the thin film transistor 201. For example, the periphery region 20 further comprises a first planarization layer 111, and the first wire 150a is electrically connected to the second wire 140 through a via-hole in the first planarization layer 11. For example, the via-hole in the first planarization layer 111 is located in the periphery region 20.

Figure 5A:
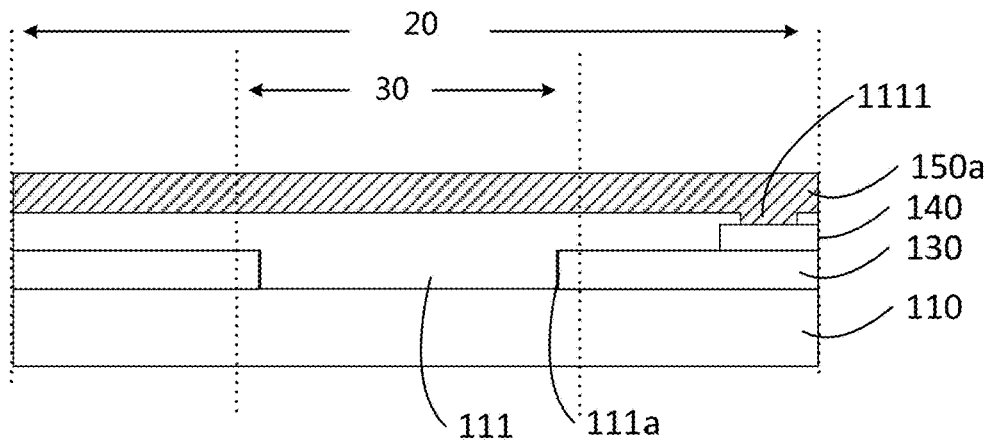
FIG. 5A is a sectional schematic diagram of a periphery region of an organic light emitting display panel, along a line parallel to an extending direction of each wire provided by an embodiment of the present disclosure.
Figure 5B:
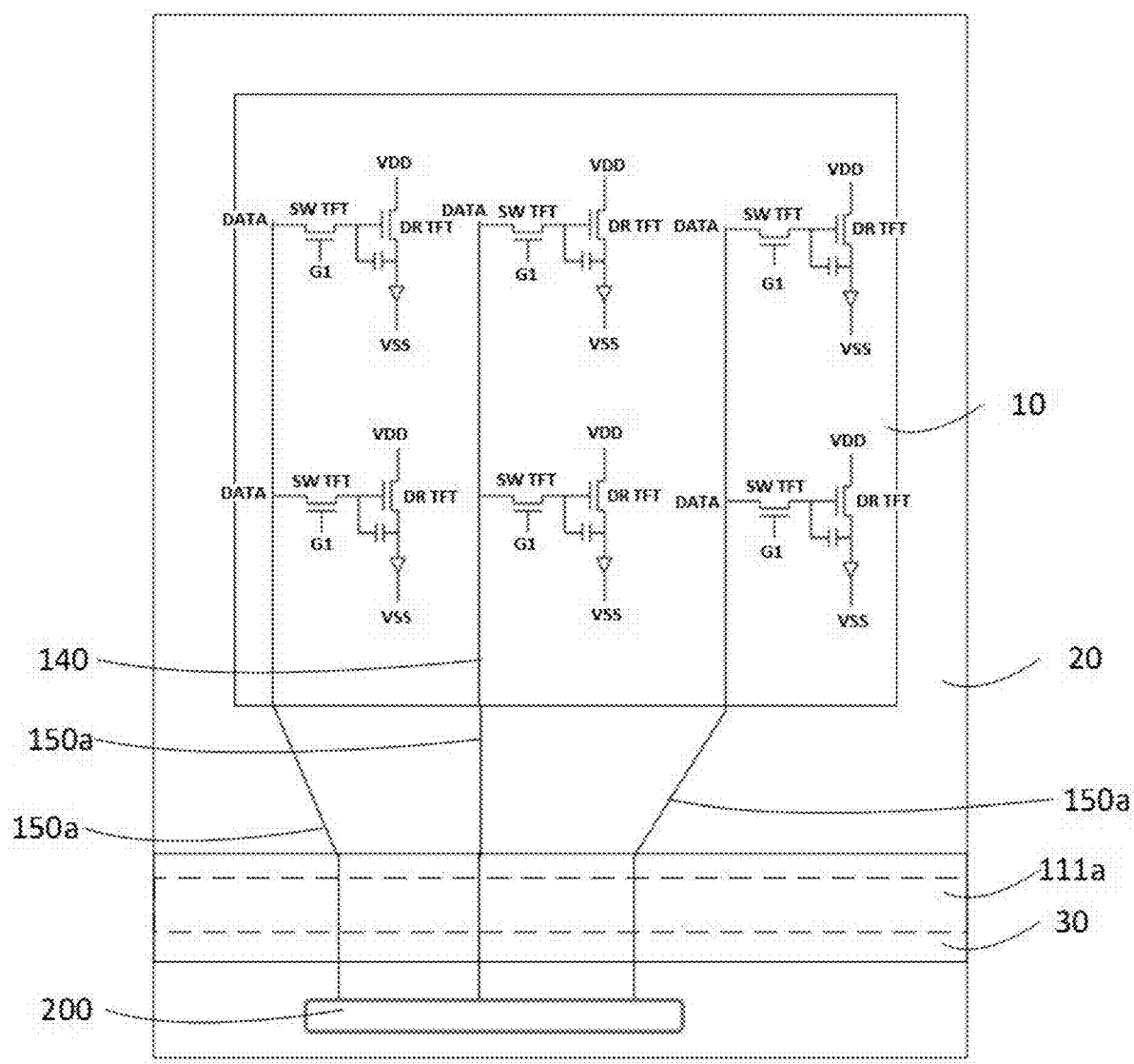
FIG. 5B is a plane schematic diagram of an organic light emitting display panel provided by an embodiment of the present disclosure.

For example, FIG. 5A is a sectional schematic diagram of the periphery region along a line parallel to each wire (for example, along an extending direction of the first wire 150a in FIG. 5B). As illustrated in FIG. 5A and FIG. 5B, the second wire 140 may extend from the display region 10 to the periphery region 20, and the second wire 140 and the first wire 150a are electrically connected with each other through the via-hole 1111 formed in the first planarization layer 111, and therefore the second wire 140 can transmit electrical signals to the first wire 150a. In the example, as illustrated in FIG. 5A, the first wire 150a is formed after the first planarization layer 111 is formed, and because the first wire 150a is formed on the first planarization layer 111, a more regular first wire 150a can be formed, and the pattern of the formed wire can be more controllable, so that undesirable situations such as misalignment between the second wire 140 and the first wire 150a, short circuit between adjacent second wires 140 or adjacent first wires 150a, and so on can be prevented in the case where the bending region 30 is bent.

For example, FIG. 5B is a schematic diagram of connections of part of wires in the display panel provided in at least one embodiment of the present disclosure. As illustrated in FIG. 5B, the pixel driving circuit of each pixel unit comprises a 2T1C driving circuit, that is, the pixel driving circuit of each pixel unit comprises two thin film transistors (i.e., a driving transistor DR TFT and a switching transistor SW TFT) and one storage capacitor. In this example, the second wire 140 is a data line connected to the source electrode or the drain electrode of the switching transistor and a data driving chip 200 to provide data signals for display. The first wire 150a in the periphery region 20 is electrically connected to the second wire 140 and also electrically connected to the driving chip 200, so that the first wire 150a can transmit data signals obtained from the driving chip 200 to the second wire 140. In the example, the first wire 150a in the periphery region transmits the data signals to the display region, but it should be understood that embodiments of the present disclosure are not limited in this aspect.

Figure 6:
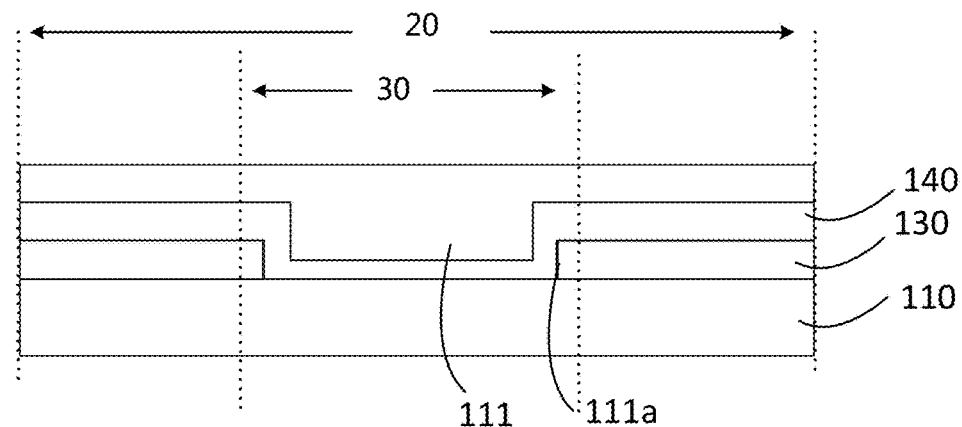
FIG. 6 is another sectional schematic diagram of a periphery region of an organic light emitting display panel along a line parallel to an extending direction of each wire provided by an embodiment of the present disclosure.
Figure 7A:
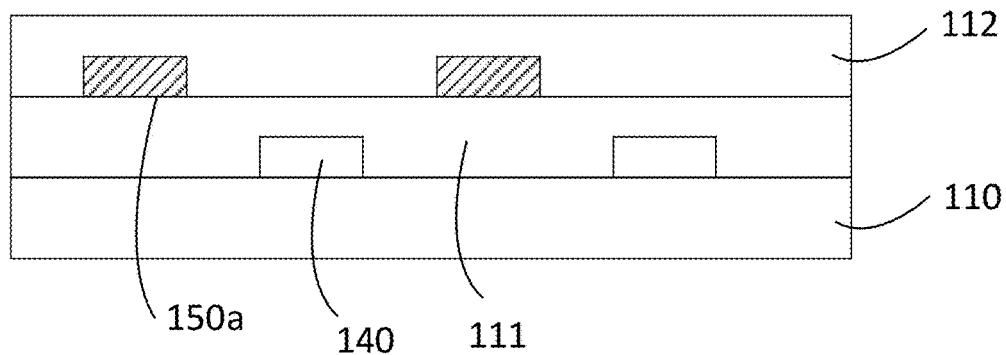
FIG. 7A is a sectional schematic diagram of a periphery region of an organic light emitting display panel along a line perpendicular to an extending direction of each wire provided by an embodiment of the present disclosure.
Figure 7B:
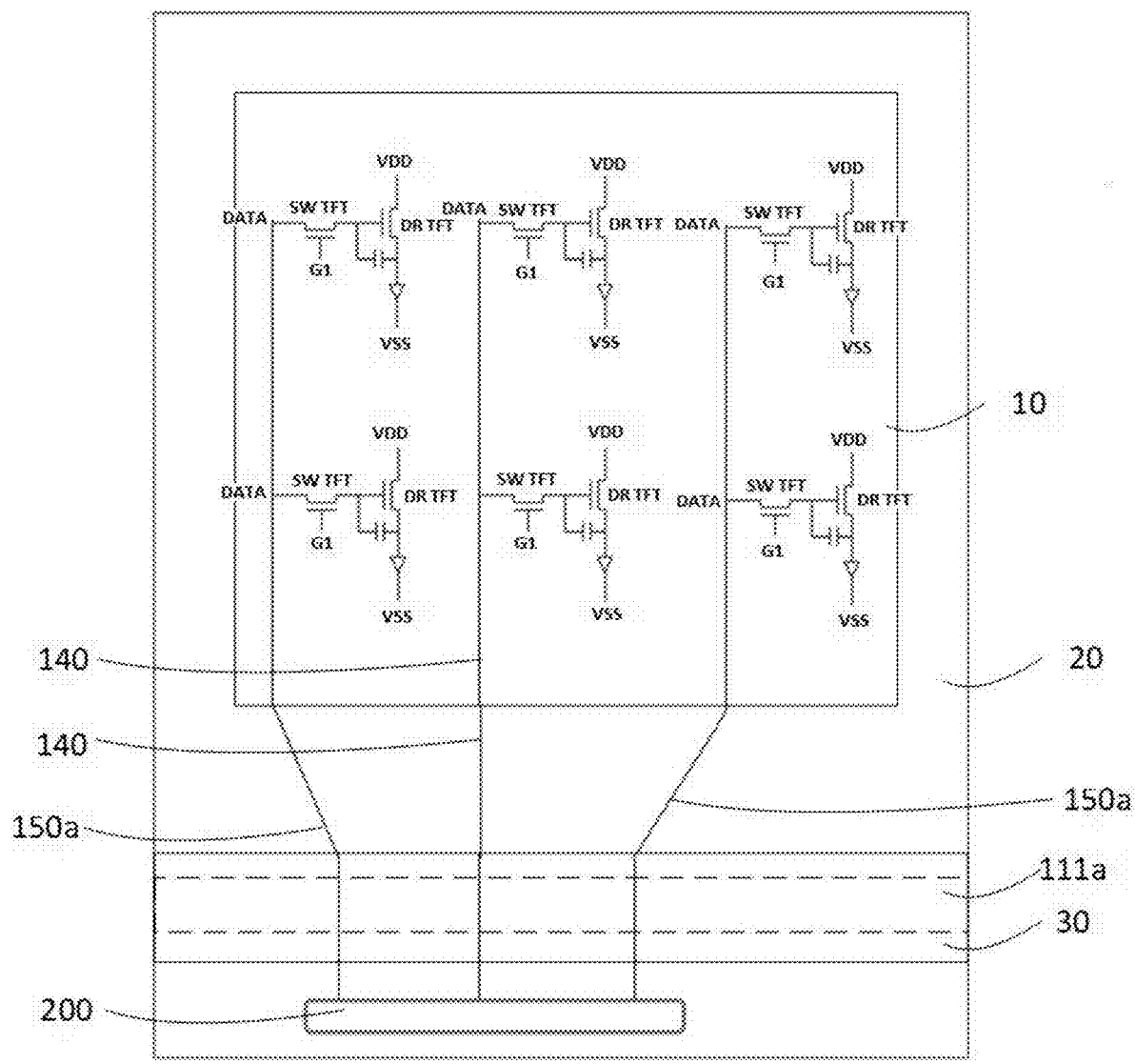
FIG. 7B is another plane schematic diagram of an organic light emitting display panel provided by an embodiment of the present disclosure.

For example, in another example of the embodiment, FIG. 6 shows a sectional schematic diagram of the periphery region along a line parallel to an extending direction of each wire (for example, along an extending direction of the second wire 140 in FIG. 7B). As illustrated in FIG. 6, the second wire 140 may extend across the groove 111a (for example, the whole periphery region 20) and connect to the driving chip 200; and in this case, the second wire 140 does not electrically connect to the first wire I 50a, and the first planarization layer is formed on the second wire 140.

For example, in this example, the first wire and the second wire may be alternately disposed in the periphery region along the direction perpendicular to the extending direction of the second wire and parallel to the base substrate, so as to transmit data signals. For example, FIG. 7A is a sectional schematic diagram of the periphery region along a line perpendicular to the extending direction of the first wire 150a and the second wire 140. As illustrated in FIG. 7A, the first wire 150a and the second wire 140 are alternately disposed on different sides of the first planarization layer 111. For example, the periphery region comprises a plurality of first wires; the display region comprises a plurality of second wires, and the plurality of second wires extend from the display region to the periphery region; and orthographic projections of the plurality of first wires on the base substrate and orthographic projections of the plurality of second wires on the base substrate are alternately arranged in the periphery region.

For example, in this example, the periphery region 20 may further comprise a bending region 30, and the bending region 30 comprises at least one groove 111a, the first planarization layer 111 is formed on the second wire 140 to planarize the groove 111a and the second wire 140 (for example, to allow the display region 10 formed with the second wire 140 and the groove 111a to have a flat surface), and both the first wire 150a and the second wire 140 extend across the bending region 30.

For example, in this example, the insulating layer 130 in the bending region 30 comprises an inorganic material layer, the groove 111a is formed at least in the inorganic material layer, part of the second wire 140 is on the inorganic material layer, part of the second wire 140 is the groove 111a, the first planarization layer 111 is on the second wire 140, and the first wire 150a is on the first planarization layer 111. In an example, the second wire 140, the first planarization layer 111 and the first wire 150a are sequentially disposed on the insulating layer 130 formed with the groove 111a in the bending region 30.

For example, FIG. 7B is another schematic diagram of connections of part of wires in the display panel provided by the embodiment. As illustrated in FIG. 7B, the first wire 150a and the second wire 140 extend across the bending region 30 and are connected to the driving chip 200, so that both the first wire 150a and the second wire 140 can transmit data signals obtained from the driving chip 200 to the display region. In this example, the first wire and the second wire are alternately arranged along the direction perpendicular to the extending direction of the second wire. In this example, the first wire 150a and the second wire 140 at different layers may collectively transmit electrical signals for the display region. In the case where the area of the periphery region 20 is constant, the double-layer wire design can allow more wires to be disposed in the periphery region 20; alternatively, in the case where the resolution of the display region is high (there are too many pixels in the display region), more wires need to be disposed in the periphery region 20, and the double-layer wire design can also reduce the area of the periphery region 20 for arranging the wires, which is advantageous for the narrow bezel design of the display panel. In addition, the first wire 150a and the second wire 140 are alternately disposed on different sides of the first planarization layer, so that the wire arrangement can be more regular, and the distance between adjacent wires in same one layer is increased, so that in the case where the bending region 30 is bent, situations such as misalignment or short circuit of each wire can be prevented.

In at least one embodiment of the present disclosure, as illustrated in FIG. 2, a sub-pixel of the display panel may further comprise other structures such as a storage capacitor 202 (which comprises a first electrode 125 and a second electrode 126), a pixel definition layer 113, and a package layer 190 (which comprises a three-layer structure including a first inorganic material layer 191, an organic material layer 192, and a second inorganic material layer 193) and so on, and no limitation will be given to the embodiment of the present disclosure in this aspect. For example, the two electrodes of the storage capacitor 202 are electrically connected to the gate electrode and the source electrode or the drain electrode of the transistor 201, respectively.

For example, in at least one embodiment of the present disclosure, the light shielding layer and the fingerprint detection circuit form a fingerprint detection unit in the display region. The fingerprint detection circuit electrically connects with a processor and sends the received signals to the processor for further processing, so as to obtain a fingerprint image for applications such as unlocking, payment and so on. The fingerprint detection circuit 120 is an optical fingerprint detection circuit. For example, the fingerprint detection circuit 120 may comprise a photodiode and a switch transistor; the photodiode may convert visible light or infrared light signals, which is incident onto the photodiode, into electrical signals, and the switch transistor may be electrically connected with the photodiode to control whether or not the photodiode is in a light signal collecting state and to control time for collecting the light signals. For example, the type and the arrangement of the photodiode can be selected according to practical application requirements, and are not specifically limited by the embodiments of the present disclosure. For example, the photodiode may be a PIN junction photodiode, a phototransistor, and so on, so that the response speed of the photodiode can be improved.

For example, in the case where the fingerprint detection unit is in operation, as illustrated in FIG. 8, the user's finger is pressed on the panel surface of the display panel, for example, the finger pressed on the package layer 190 can reflect light emitted by the light emitting component 203 of the display panel, so that the light carrying the fingerprint information of the finger can be transmitted through the opening 151 in the light shielding layer 150 to the fingerprint detection circuit 120 corresponding to the opening 151 (based on the principle of small hole imaging), and the fingerprint detection circuit 120 can collect the light carrying the fingerprint information and covert the collected light in to electrical signals, and the electrical signals can be converted into the fingerprint image that can be processed digitally.

For example, in at least one embodiment of the present disclosure, as illustrated in FIG. 9, the light shielding layer 150 may comprise a plurality of openings 151. For example, nine openings 151 are illustrated in FIG. 9. In other embodiments, the number of openings may also be set to be other values, such as four, six, eight, ten, and so on, and no limitation will be given to the embodiment of the present disclosure in this aspect. For example, the plurality of openings 151 may be arranged in an array. The fingerprint detection circuit 120 may comprises a plurality of fingerprint detection sub-circuits arranged in an array, and each of the fingerprint detection sub-circuits may comprise a photodiode and a switch transistor. For example, as illustrated in FIG. 9, the fingerprint detection circuit 120 can collect the light carrying the fingerprint information simultaneously or in a time division manner (that is, the fingerprint detection sub-circuit 120 corresponding to different openings 151 collect light at different time). Because, for example, the size of each opening 151 may be relatively small, the fingerprint data transmitted through one opening 151 may not be complete. In this situation, the light 120a carrying the fingerprint information, which is collected by the fingerprint detection sub-circuits corresponding to the plurality of openings 151, can be joined (for example, stitched together) to obtain a complete fingerprint image.

It should be noted that the light shielding layer 150 may further comprise a via-hole 152, so that the pixel electrode 127 can be electrically connected to the drain electrode of the thin film transistor 201 through the via-hole 152. For example, as illustrated in FIG. 2, the orthographic projection of the via-hole 152 on the base substrate 110 is completely within the orthographic projection of the drain electrode 124, and therefore, the light reflected by a finger cannot be incident onto the fingerprint detection circuit 120 through the via-hole 152, and thus the via-hole 152 does not affect the fingerprint detection function of the fingerprint detection unit. In some example, at least part of the second planarization layer 112 is filled in part of the via-hole 152, such that the pixel electrode 127 and the light shielding layer 150 are insulated from each other.

For example, in at least one embodiment of the present disclosure, the fingerprint detection circuit in the display region may be disposed on a surface of the base substrate that is closer to the light shielding layer; alternatively, the fingerprint detection circuit in the display region may be disposed on a surface of the base substrate that is away from the light shielding layer, and no limitation will be given to the embodiment of the present disclosure in this aspect. For example, FIG. 2 illustrates the case where the fingerprint detection circuit 120 is disposed on the surface of the base substrate 110 that is closer to the light shielding layer 150. It should be noted that the fingerprint detection circuit 120 may also be disposed at a position in the insulating layer 130 on the base substrate 110. For example, the fingerprint detection circuit 120 may be disposed in same one layer as the barrier layer 131, or in same one layer as the buffer layer 132, or in same one layer as the first interlayer insulating layer 134, or on the second interlayer insulating layer 135, and so on, as long as the fingerprint detection circuit 120 does not affect the display of the display region, and these cases are also within the protection scope of the present disclosure.

In at least one embodiment of the present disclosure, the fingerprint detection unit is disposed in the display region instead of the non-display region, and the under-screen fingerprint detection function can be realized, so that the area of the periphery region can be reduced, which is advantageous for the narrow bezel design of the display panel. In addition, the light shielding layer of the fingerprint detection unit may be disposed in same one layer as the first wire in the periphery region, and therefore the light shielding layer and the first wire may be formed in a single patterning process, which integrates manufacture processes of the display region and the periphery region, and simplifies the processes.

Figure 11:
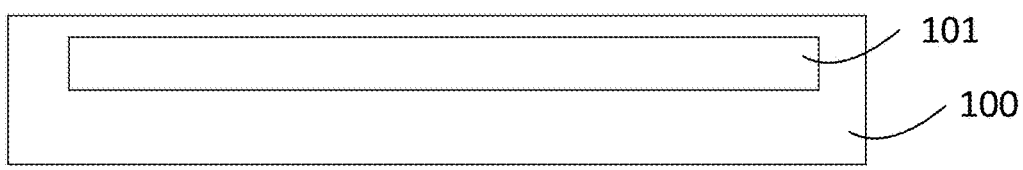
FIG. 11 is a schematic diagram of a display device by an embodiment of the present disclosure.

At least one embodiment of the present disclosure provides a display device. For example, the display device comprises the display panel provided by any of the embodiments of the present disclosure. As illustrated in FIG. 11, the display device 100 comprises any of the above-mentioned organic light emitting display panels (for example, the organic light emitting display panel 101 as illustrated in FIG. 11). The display device 100 may be any product or component having a display function, such as a mobile phone, a tablet computer, a television, a display, a notebook computer, a digital photo frame, a navigator, and so on.

It should be noted that, for the display panel and the display device of the present disclosure, other essential components (such as an image data encoding/decoding device, a line scan driver, a column scan driver, a clock circuit and so on) may adopt suitable components, which should be understood by those skilled in the art, and should not be construed as limitations of the embodiments of the present disclosure.

Figure 10A:
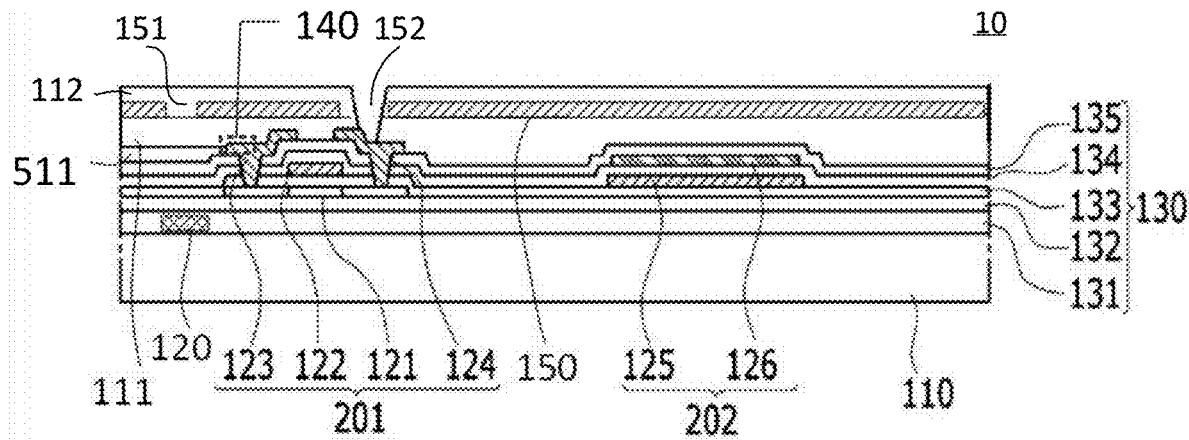
FIG. 10A is a schematic diagram illustrating a display region of an organic light emitting display panel before the manufacture process of the organic light emitting display panel is completely finished, provided by an embodiment of the present disclosure.
Figure 10B:
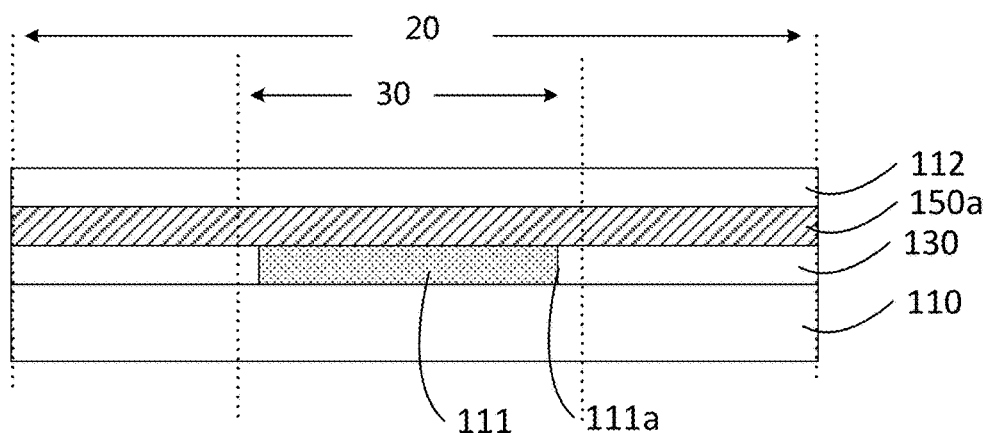
FIG. 10B is a schematic diagram illustrating a periphery region of an organic light emitting display panel before the manufacture process of the organic light emitting display panel is completely finished, provided by an embodiment of the present disclosure.

At least one embodiment of the present disclosure provides a manufacture method of an organic light emitting display panel, the method comprises forming a display region and a periphery region. As illustrated in FIG. 10B, a first wire 150a is formed in the periphery region 20. As illustrated in FIG. 10A, a light shielding layer 150 and a fingerprint detection circuit 120 are formed in the display region 10. The light shielding layer 120 comprises at least one opening 151, the at least one opening 151 at least partially overlaps the fingerprint detection circuit 120 in a direction perpendicular to the panel surface of the display panel to allow light passing through the opening 151 to be incident onto the fingerprint detection circuit 120. In at least one embodiment of the present disclosure, the light shielding layer 150 and the first wire 150a are formed by a single patterning process using same one film.

For example, the material of the light shielding layer 150 and the first wire 150a may comprise a metal or a metal alloy, and the metal comprises titanium, aluminum, molybdenum, copper, and so on. For example, the material of the light shielding layer 150 and the first wire 150a may also be a stack layer of metal materials, such as a stack layer of three metal layers of titanium/aluminum/titanium, a stack layer of three metal layers of molybdenum/aluminum/molybdenum, and so on, and no limitation will be given to the embodiment of the present disclosure in this aspect.

For example, one patterning process may comprise processes such as photoresist coating, exposing, developing, etching and so on, which will not be described in detail here.

In at least one embodiment of the present disclosure, the fingerprint detection unit is formed in the display region instead of the non-display region, so that the area of the periphery region can be reduced, which is advantageous for the narrow bezel design of the display panel. In addition, the light shielding layer of the fingerprint detection unit and the first wire in the periphery region are formed by a single patterning process, so that manufacture processes of the display region and the periphery region are integrated, and the manufacture processes are simplified.

For example, the manufacture method of an organic light emitting display panel provided by the embodiment may further comprise processes of forming a thin film transistor 201, a capacitor 202, an insulating layer 130 and so on. Basic configurations of these structures may refer to the above-mentioned embodiments, and the structures may be formed by patterning processes, and so on, which are not described in detail here.

For example, as illustrated in FIG. 10A, the light shielding layer 150 may be formed above the thin film transistor 201. For example, a first planarization layer 111 is formed on the thin film transistor 201, and then the light shielding layer 150 is formed on the first planarization layer 111.

For example, the manufacture method of an organic light emitting display panel provided by the embodiment may further comprise: forming a plurality of openings arranged in an array in the light shielding layer. For example, at least part of the plurality of openings may be formed at a position adjacent to the opening 151 in FIG. 10A, as long as the openings do not affect the display effect of the display region and the fingerprint detection function of the fingerprint detection unit.

For example, in at least one embodiment of the present disclosure, as illustrated in FIG. 10A, a via-hole 152 may be formed while forming the opening 151 in the light shielding layer 150 for realizing electrical connecting between, for example, the pixel electrode and the thin film transistor 201.

For example, in at least one embodiment of the present disclosure, the fingerprint detection circuit in the display region may be formed on the surface of the base substrate that is closer to the light shielding layer, alternatively, the fingerprint detection circuit in the display region may be formed on the surface of the base substrate that is away from the light shielding layer, and no limitation will be given to at least one embodiment of the present disclosure in this respect.

For example, FIG. 10A illustrates the case where the fingerprint detection circuit 120 is formed on the surface of the base substrate 110 that is closer to the light shielding layer 150. It should be noted that the fingerprint detection circuit 120 may also be formed at a position in the insulating layer 130 on the base substrate 110. For example, the fingerprint detection circuit 120 may be formed in same one layer as the barrier layer 131, or in same one layer as the buffer layer 132, or in same one layer as the first interlayer insulating layer 134, or on the second interlayer insulating layer 135, and so on, as long as the fingerprint detection circuit 120 does not affect the display of the display region, and these cases are also within the protection scope of the present disclosure.

For example, in the manufacture method of an organic light emitting display panel provided by the embodiment, as illustrated in FIG. 10B, at least one groove 111a may be formed in the periphery region and a flexible insulating material may be filled in the groove 111a to form a bending region. For example, the first wire 150a may extend across the bending region. For example, in other examples, a plurality of grooves 111a, for example, grooves of two, three, four, and so on, in parallel may be formed, as long as the bending region can be bent, so as to allow, for example, the area of the orthographic projection of the periphery region on the base substrate to be reduced when the periphery region 20 is bent.

For example, the flexible insulating material filled in the groove 111a is at least part of the first planarization layer 111, and the material of the first planarization layer 111 may comprise, for example, an insulating material such as polyimide, resin, and so on.

For example, the insulating layer 130 in the bending region comprises an inorganic material layer, and the material of the inorganic material layer may comprise, for example, silicon nitride, silicon oxide, and so on. Because the inorganic material layer may be brittle and not easily to be bent, the groove 111a may be formed in the inorganic material layer, and then the flexible insulating material may be filled in the groove 111a to form a bendable portion. In at least one embodiment of the present disclosure, for example, the first wire 150a may be formed to extend across the inorganic material layer.

In at least one embodiment of the present disclosure, the insulating layer 130 is also formed in the display region 10. For example, the insulating layer 130 formed in the display region 10 comprises a barrier layer 131, a buffer layer 132, a gate insulating layer 133, a first interlayer insulating layer 134, and a second interlayer insulating layer 135. For example, the insulating layer 130 formed in the bending region may comprise one or more of the barrier layer 131, the buffer layer 132, the gate insulating layer 133, the first interlayer insulating layer 134, and the second interlayer insulating layer 135. For example, the buffer layer 132 in the display region 10 is formed of an inorganic material, and in this case, at least the inorganic material layer in the bending region 30 and the buffer layer 132 in the display region 10 may be formed in a single patterning process.

For example, the bending region may be bent at the groove 111a filled with the flexible insulating material, and therefore the area of the periphery region, in the plane where the display region locates, is reduced, which is advantageous for the narrow bezel design of the display panel.

For example, as illustrated in FIG. 10A, a second wire 140 may further be formed in the display region, and the second wire 140 extends from the display region to the periphery region. In one example, the first wire 150a is formed to be electrically connected to the second wire 140 in the periphery region.

For example, referring to FIG. 5A, the first planarization layer 111 is also formed in the periphery region 20, and a via-hole 1111 exposing the second wire 140 is formed in the planarization layer 111, and then the first wire 150a is formed, so that the first wire 150a may be electrically connected to the second wire 140 through the via-hole in the first planarization layer 111. In the example, the first wire 150a is formed after the first planarization layer 111 is formed. Because the first wire 150a is formed on the first planarization layer 111 that is flat, a more regular first wire 150a may be formed, and the pattern of the formed wire may be more controllable, and in the case where the bending region 30 is bent, undesirable situations such as misalignment, short circuit, and so on may be prevented.

For example, in another example, referring to FIG. 6, the second wire 140 may be formed to extend across the whole periphery region 20 instead of being electrically connected to first wire 150a. In this situation, the first planarization layer is formed on the second wire 140.

For example, in the example as illustrated in, for example, FIG. 6, the first wire 150a and the second wire 140 may be alternately formed in the periphery region 20 along the direction, which is perpendicular to the extension direction of the second wire 140 and parallel to the base substrate, to transmit data signals. For example, referring to FIG. 7A, the first wire 150a and the second wire 140 are alternately formed on different sides of the first planarization layer 111. For example, the second wire 140 is formed firstly, and then the first planarization layer 111 is formed on the second wire 140, and then the first wire 150a is formed at a position on the first planarization layer 111 corresponding to an interval of the second wire 140. In this case, the structure of the first wire 150a and the second wire 140 is substantially the same as or similar to the structure illustrated in FIG. 5A, and no further descriptions will be given here. After the first wire 150a is formed, a second planarization layer 112 may be formed further.

For example, in the example as illustrated in, for example, FIG. 6, a bending region 30 may also be formed in the periphery region 20, at least one groove 111a is formed in the bending region, and the first planarization layer is formed on the second wire 140 to planarize the groove 111a and the second wire 140. The first wire 150a and the second wire 140 extend across the bending region 30.

For example, in the example, the insulating layer 130 formed in the bending, region 30 comprises an inorganic material layer, the groove 111a is formed at least in the inorganic material layer, the second wire 140 is formed on the inorganic material layer, the first planarization layer 111 is formed on the second wire 140, and the first wire 150a is formed on the first planarization layer 111.

In the example, the first wire 150a and the second wire 140 formed in different layers may collectively transmit data signals for the display region. In the case where the area of the periphery region 20 is constant, the double-layer wire design may allow more wires to be disposed in the periphery region 20; alternatively, in the case where there are too many pixels in the display region, more wires need to be disposed in the periphery region 20, and the double-layer wire design may reduce the area of the periphery region 20 for arranging the wires, which is advantageous for the narrow bezel design of the display panel. In addition, the first wire 150a and the second wire 140 are alternately disposed on different sides of the first planarization layer, so that the wire arrangement can be more regular, and the distance between adjacent wires in same one layer is larger, so that where the bending region 30 is bent, situations such as misalignment or short circuit of each wire can be prevented.

It should be noted that, in at least one embodiment of the present disclosure, the forming of the display region may further comprise forming structures such as a pixel definition layer, an organic light emitting component, a package component, and so on, and the structures may be formed by related methods, and no limitation will be given to at least one embodiment of the present disclosure in this respect.

The following statements should be noted. (1) The accompanying drawings involve only the structure(s) in connection with the embodiment(s) of the present disclosure, and other structure(s) can be referred to common design(s). (2) For the purpose of clarity only, in accompanying drawings for illustrating the embodiment(s) of the present disclosure, the thickness of a layer or a structure may be enlarged or reduced. However, it should understood that, in the case in which a component or element such as a layer, film, area, substrate, and so on is referred to be "on" or "under" another component or element, it may be directly on or under the another component or element or a component or element is interposed therebetween. (3) In case of no conflict, features in one embodiment or in different embodiments can be combined to obtain new embodiments.

The above-mentioned descriptions are only specific embodiments of the present disclosure, but the protection scope of the present disclosure is not limited thereto, those skilled in the art may make some improvements and modifications within the technical scope of the present disclosure, and the improvements and modifications should be within the protection scope of the present disclosure. Therefore, the protection scope of the present disclosure should be determined by the protection scope of the claims.

What is claimed is:

1. A light emitting display panel, comprising a display region and a periphery region,
wherein the periphery region comprises a first wire;
the display region comprises a light shielding layer and a fingerprint detection circuit;
the light shielding layer comprises at least one opening, and the at least one opening at least partially overlaps the fingerprint detection circuit in a direction perpendicular to a panel surface of the display panel to allow light passing through the opening to be incident onto the fingerprint detection circuit;
the light shielding layer and the first wire are in same one layer;
the light emitting display panel further comprises a base substrate;
the display region further comprises a light emitting component on the base substrate;
the light shielding layer is on a side, which is closer to the base substrate, of the light emitting component;
the display region further comprises a thin film transistor for driving the light emitting component; and
the light shielding layer is between the thin film transistor and the light emitting component in the direction perpendicular to the panel surface of the display panel.

2. The light emitting display panel according to claim 1, wherein the periphery region comprises a bending region;
the bending region comprises at least one groove and a flexible insulating material filled in the groove; and
the first wire extends across the bending region.

3. The light emitting display panel according to claim 2, wherein the bending region comprises an inorganic material layer;
the groove is formed in the inorganic material layer; and
the first wire further extends on the inorganic material layer.

4. The light emitting display panel according to claim 1, wherein the display region further comprises a second wire;
the second wire extends from the display region to the periphery region; and
the second wire electrically connects with the first wire.

5. The light emitting display panel according to claim 4, wherein the second wire is in same one layer as a source electrode or a drain electrode of the thin film transistor.

6. The light emitting display panel according to claim 4, wherein the second wire and a gate electrode of the thin film transistor are in same one layer.

7. The light emitting display panel according to claim 1, wherein the display region further comprises a second wire and the second wire extends from the display region to the periphery region; and
the periphery region further comprises a first planarization layer, and the first wire and the second wire are respectively on different sides of the first planarization layer in the direction perpendicular to the panel surface of the display panel.

8. The light emitting display panel according to claim 7, wherein the second wire is closer to the base substrate compared with the first wire.

9. The light emitting display panel according to claim 7, wherein the periphery region comprises a plurality of first wires;
the display region comprises a plurality of second wires, and the plurality of second wires extend from the display region to the periphery region; and
the plurality of first wires and the plurality of second wires are alternately disposed on the different sides of the first planarization layer.

10. The light emitting display panel according to claim 1, wherein the periphery region comprises a plurality of first wires;
the display region comprises a plurality of second wires, and the plurality of second wires extend from the display region to the periphery region; and
orthographic projections of the plurality of first wires on the base substrate and orthographic projections of the plurality of second wires on the base substrate are alternately arranged in the periphery region.

11. The light emitting display panel according to claim 7, wherein the periphery region comprises a bending region and the bending region comprises at least one groove; and
at least part of the first planarization layer is filled in the groove, and both the first wire and the second wire extend across the bending region.

12. The light emitting display panel according to claim 11, wherein the bending region comprises an inorganic material layer;
the groove is formed in the inorganic material layer;
the second wire is on the inorganic material layer;
the first planarization layer is on the second wire; and
the first wire is on the first planarization layer.

13. The light emitting display panel according to claim 1, wherein the light shielding layer comprises a plurality of openings and the plurality of openings are arranged in an array.

14. The light emitting display panel according to claim 1, wherein the fingerprint detection circuit is on a surface, which is closer to the light shielding layer, of the base substrate; alternatively,
the fingerprint detection circuit is on a surface, which is away from the light shielding layer, of the base substrate.

15. A display device, comprising the light emitting display panel according to claim 1.

16. A manufacture method of a light emitting display panel, comprising forming a display region and a periphery region,
wherein a first wire is formed in the periphery region;
a light shielding layer and a fingerprint detection circuit are provided in the display region;
the light shielding layer comprises at least one opening, the at least one opening at least partially overlaps the fingerprint detection circuit in a direction perpendicular to a panel surface of the display panel to allow light passing through the opening to be incident onto the fingerprint detection circuit, and
the light shielding layer and the first wire are formed from a same material layer by a patterning process;
the light emitting display panel further comprises a base substrate;
the display region further comprises a light emitting component on the base substrate;
the light shielding layer is on a side, which is closer to the base substrate, of the light emitting component;
the display region further comprises a thin film transistor for driving the light emitting component; and
the light shielding layer is between the thin film transistor and the light emitting component in the direction perpendicular to the panel surface of the display panel.

17. The manufacture method of the light emitting display panel according to claim 16, further comprising:

forming a plurality of openings arranged in an array in the light shielding layer.

18. The manufacture method of the light emitting display panel according to claim 16, further comprising:
forming at least one groove in the periphery region; and
filling a flexible insulating material in the groove to form a bending region, wherein the first wire is formed to extend across the bending region.

* * * * *